United States Patent
Bliss et al.

(10) Patent No.: US 6,774,825 B2
(45) Date of Patent: Aug. 10, 2004

(54) MODULATION CODING BASED ON AN ECC INTERLEAVE STRUCTURE

(75) Inventors: William G. Bliss, Thornton, CO (US); Andrei Vityaev, Santa Clara, CA (US); Razmik Karabed, San Jose, CA (US); Ali Najafi, Sunnyvale, CA (US); Jonathan Ashley, Santa Clara, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/253,909

(22) Filed: Sep. 25, 2002

(65) Prior Publication Data

US 2004/0056786 A1 Mar. 25, 2004

(51) Int. Cl.[7] ................................................. H03M 7/00
(52) U.S. Cl. ........................................ 341/81; 714/755
(58) Field of Search .................... 341/81, 107; 714/755, 714/752

(56) References Cited

U.S. PATENT DOCUMENTS

| | | | | |
|---|---|---|---|---|
| 5,297,170 A | * | 3/1994 | Eyuboglu et al. | 375/242 |
| 5,721,745 A | * | 2/1998 | Hladik et al. | 714/755 |
| 5,757,294 A | | 5/1998 | Fisher et al. | |
| 6,029,264 A | * | 2/2000 | Kobayashi et al. | 714/755 |
| 6,229,458 B1 | | 5/2001 | Altekar et al. | |
| 6,285,302 B1 | | 9/2001 | McClellan | |
| 6,473,010 B1 | * | 10/2002 | Vityaev et al. | 341/107 |
| 6,504,493 B1 | | 1/2003 | Burd | |

OTHER PUBLICATIONS

"Flexible Bit Selection Using Turbo Trellis–Coded Modulation", Gary Q. Jin, US Application No. 10/098,474, filed on Mar. 18, 2002.*
"Encoding and Decoding Apparatus and Method", Zheng et al., U.S. Application No. 10,066,658), filed on Feb. 6, 2002.*
Wengerter et al. (U.S. Application No. 10/244,105), "Interleaver Pattern Modification", filed on Sep. 16, 2002.*

* cited by examiner

*Primary Examiner*—Jean Jeanglaude
(74) *Attorney, Agent, or Firm*—Staas & Halsey LLP

(57) ABSTRACT

A system and method to modulate coding based on an ECC interleave structure include a first encoder encoding an input stream of bits comprising input blocks sorted into interleaves. A second encoder encodes a subset of the input blocks to produce output blocks, where the first encoder permutates a remainder of the input blocks and the output blocks to produce a codeword.

25 Claims, 2 Drawing Sheets

MODULATION CODING BASED ON AN ECC INTERLEAVE STRUCTURE

BACKGROUND OF THE INVENTION

1. Field of the Invention

The present invention relates to an apparatus and a method to encode information based on an ECC interleave structure.

2. Description of the Related Art

In magnetic recording, various sources of noise can corrupt accurate information (for example, thermal noise, interference, and media noise arising from sources such as jitter, DC erase noise, and pulse width/height modulation). Media noise is a dominant source of noise in many current recording systems. The media noise is usually treated as highly correlated non-stationary noise added to a read-back signal.

RLL Coding schemes use (d, k) constraints, which limit a minimum and a maximum run lengths of zeros, respectively, or alternatively, the schemes control high and low frequency contents of user data. Conventional high-rate RLL (0, k) codes are highly complex for circuit implementation and relatively "blind" in terms of error detection during a demodulation process. The d, k constraints include properties of the conventional codes exploitable for error control purposes. However, this specialized type of error is only a small subset of the total number of possible errors.

A construction of an encoder, which encodes arbitrary binary sequences into sequences, is needed that obeys a specific run-length-limited (RLL) constraint. It is important that the encoder encodes data at a high rate, that the decoder does not propagate channel errors, and that a complexity of encoding and decoding be low.

White noise is added to every symbol entering a channel in a magnetic recording medium. Media Noise, like white noise, is random. Unlike the white noise, the media noise is not added to every symbol. The denser a signal is written onto the magnetic recording medium, the more frequent media noise occurs. Thus, a recording density controls a ratio of media noise to white noise. For instance, a ratio of 50:50 may be one example.

In general, in magnetic recording systems, it is desirable that certain conditions are met where typical channel errors do not corrupt many blocks of a codeword in a same interleave, and that a length of typical channel errors is short. Also, it is desirable that short channel errors do not propagate into long decoder errors, and that a number of non-zero values over the codeword is large. If these conditions were not satisfied, then the magnetic recording medium would require a more powerful error correcting code (ECC), which increases hardware complexity of a magnetic recording system. Regarding the condition where the number of non-zero values over a codeword is large, the non-zero values over a codeword is large, the non-zero values are important because the non-zero values provide useful information to recover a system clock.

With respect to the condition where the length of typical channel errors need to be short, a long typical channel error may occur when for some pair of integers, k and M, where:

$$(x(k+1), x(k+2), \ldots, x(k+M))=x^*(1\ 0\ 1\ 0\ 1\ 0 \ldots),$$

or $$(x(k+2^*1), x(k+2^*2), \ldots, x(k+2M))=x^*(1\ 1\ 1\ 1\ 1 \ldots),$$

where $x^* \in \{0, 1\}$

The apparatus and method according to an embodiment of the present invention, provide a system where the channel errors do not corrupt many blocks in the same interleave, where the length of the typical channel errors are short, and where the short channel errors do not propagate into long decoder errors.

SUMMARY OF THE INVENTION

Various objects and advantages of the invention will be set forth in part in the description that follows and, in part, will be obvious from the description, or may be learned by practice of the invention.

In order to achieve the above and other objects, a system to modulate coding based on an ECC interleave structure, includes: a first encoder encoding an input stream of bits including input blocks sorted into interleaves; and a second encoder encoding a subset of the input blocks to produce output blocks, wherein the first encoder permutates a remainder of the input blocks and the output blocks to produce a codeword.

In order to achieve the above and other objects, a system to modulate coding based on an ECC interleave structure, includes: a first encoder encoding an input stream of bits, sorting the input bits into interleaves of input blocks, and selecting at least one subset of the input blocks, wherein each input block includes a predetermined input block size; a second encoder encoding the at least one subset of the input blocks to output blocks, wherein the first encoder permutates a remainder of the input blocks and the output blocks to prevent channel errors from being greater than a correction capability of the interleave; and a decoder inverse decoding the output blocks to restore the input blocks.

In order to achieve the above and other objects, a method to modulate coding based on an ECC interleave structure, includes: encoding an input stream of bits with a first encoder; sorting the input bits into interleaves of input blocks, each input block including a predetermined input block size; selecting at least one subset of the input blocks; encoding with a second encoder the at least one subset of the input blocks to output blocks; permutating a remainder of the input blocks and the output blocks to prevent channel errors from being greater than a correction capability of the interleave; and inverse decoding the output blocks to restore the input blocks.

In order to achieve the above and other objects, a method to modulate coding based on an ECC interleave structure, includes: selecting an n/m rate of a first encoder; receiving an input signal including input bits, b(i)'s, wherein i=1, 2, . . . n; selecting an input block size, S, for the input bits, b(i)'s; interleaving the input bits, b(i)'s, into blocks, (B1–Bk), each block including the input block size, S, wherein k=n/S; selecting at least one subset, (Bi1, Bi2, . . . , Biq), from the blocks, wherein q<k; mapping the at least one subset, (Bi1, Bi2, . . . , Biq) to an output vector, f=(f1, f2, . . . , fp), of a second encoder within the first encoder, wherein p is a number of output bits, f, from the second encoder; and permutating ((f1, f2, . . . , fp), Bj1, Bj2, Bj(k–q)) to prevent channel errors from being greater than a correction capability in the interleave, wherein (Bj1, Bj2, . . . Bj(k–q))=(B1–Bk)–(Bi1, Bi2, . . . , Biq), are the blocks remaining after the at least one subset, (Bi1, Bi2, . . . , Biq), is selected and the permutating is a permutation, P, operating on the bits of vector ((f1, f2, . . . , fp), Bj1, Bj2, Bj(k–q)).

In order to achieve the above and other objects, a computer readable medium storing a program for controlling at least one computer to perform a method includes: encoding an input stream of bits with a first encoder; sorting the input bits into interleaves of input blocks, each input block including a predetermined input block size; selecting at least one subset of the input blocks; encoding with a second encoder the at least one subset of the input blocks to output blocks; permutating a remainder of the input blocks and the output blocks to prevent channel errors from being greater than a correction capability of the interleave; and inverse decoding the output blocks to restore the input blocks.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Hereinafter, embodiments of the present invention will be described in detail with reference to the attached drawings. The present invention may, however, be embodied in many different forms and should not be construed as being limited to the embodiments set forth herein; rather, these embodiments are provided so that the present disclosure will be thorough and complete, and will fully convey the concept of the invention to those skilled in the art.

Figure 1:
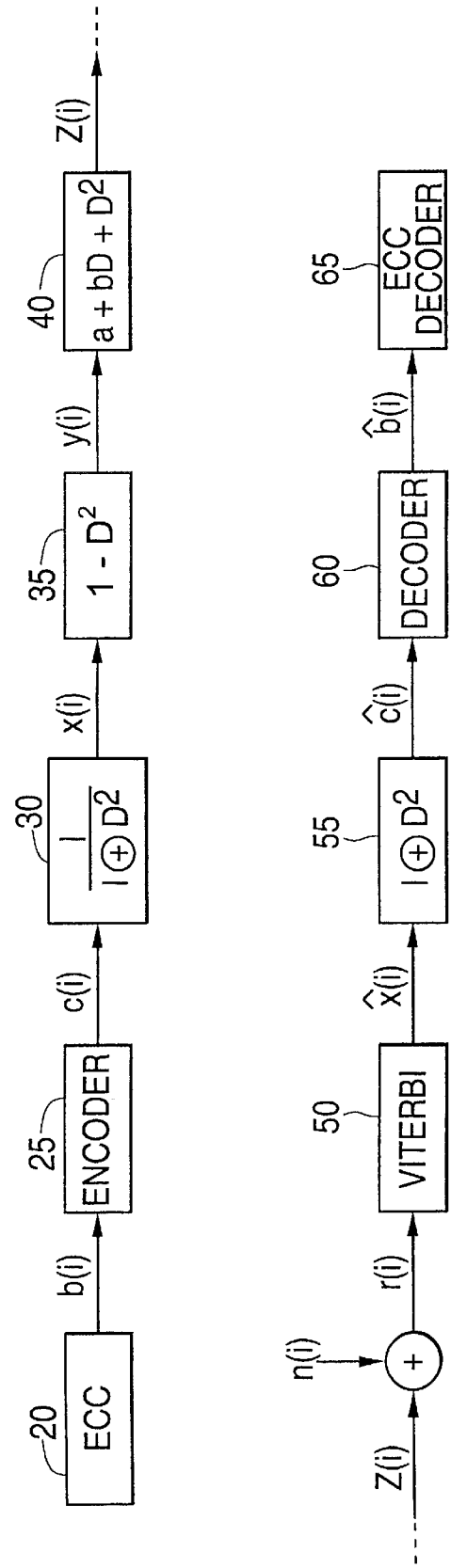
FIG. 1 is a diagram illustrating a configuration of a magnetic recording system of high rate coding for media noise, in accordance with an embodiment of the present invention.

In an embodiment according to the present invention, FIG. 1 illustrates a magnetic recording system. An ECC coded sequence, $b(i)$, which is output from an Error Correcting Code (ECC) 20, is encoded, for instance, by a rate n/m encoder 25 to produce bits, $c(i)$'s. Specifically, the ECC 20 generates codewords having binary values, $b(i)$'s, which are grouped into blocks of length S, where for every i, i>0, block, B(i) is defined by $$B(i)=(b(Si-S+1), b(Si-S+2), \ldots, b(Si-S+S-1), b(Si)).$$

The length S is called an ECC block size. According to an embodiment of the present invention, the ECC 20 output blocks, B(i)'s, which are interleaved to depth l. The ECC 20 also defines a correction capability on each interleave, t.

As previously set forth, the output of the ECC 20 is encoded by the rate n/m encoder 25 to produce bits, $c(i)$'s, where n=KS, for some integer K. Specifically, to generate a u-th codeword, the encoder 25 receives n-bits, b(SuK−SK+1), . . . , b(SuK−SK+SK), and produces m-bits, Cu=(Cu1, . . . , Cum). Thus, the encoder 25 receives n-bit blocks and produces m-bit blocks. The encoder 25 may include an application-specific integrated circuit (ASIC). Specifically, the hardware included in the system includes memories, processors, and/or ASICs. Such memory includes a machine-readable medium on which is stored a set of instructions (i.e., software) embodying any one, or all, of the methodologies described herein. Software can reside, completely or at least partially, within this memory and/or within the processor and/or ASICs. For the purposes of this specification, the term "machine-readable medium" shall be taken to include any mechanism that provides (i.e., stores and/or transmits) information in a form readable by a machine (e.g., a computer). For example, a machine-readable medium includes read only memory ("ROM"), random access memory ("RAM"), magnetic disk storage media; optical storage media, flash memory devices, electrical, optical, acoustical, or other form of propagated signals (e.g., carrier waves, infrared signals, digital signals, etc.).

The m-bit blocks are the codewords and m is a codeword length. The encoder 25 outputs the $c(i)$ to a $1/(1 \oplus D^2)$ precoder 30. The ECC 20, the encoder 25, and the precoder 30 receive, encode, and process data in a digital domain. In an alternative embodiment, the encoder 25 and the precoder 30 may be combined into one control block capable of encoding and precoding the ECC coded sequence, $b(i)$'s.

Thus, as shown in FIG. 1, the output, $x(i)$'s, of the precoder 30 pass through a cascade of channel filters denoted by $(1-D^2)$ 35 and $(a+bD+cD^2)$ 40. At the output of the filters, data $z(i)$ is corrupted by additive noise, n's, $r(i)=z(i)+n(i)$. Based on a received sequence, $r(i)$'s, a Viterbi detector 50 generates, $\hat{x}(i)$'s, which are reproductions of $x(i)$'s. Next, bits $\hat{x}(i)$'s are filtered by a filter $(1 \oplus D^2)$ 55, which is an inverse of the precoder 30, to generate $\hat{c}(i)$'s. In an alternative embodiment, the filter $(1 \oplus D^2)$ 55 may be provided with the Viterbi detector 50 as one unit. The $\hat{c}(i)$'s, are decoded by a decoder 60 to produce, $\hat{b}(i)$'s, which are reproductions of the ECC coded sequence, $b(i)$'s. An ECC decoder 65 receives the reproductions of the ECC coded sequence, $\hat{b}(i)$'s. Further, if $x(i) \neq \hat{x}(i)$, then it is determined that a channel error occurred at time i. Further, if $b(i) \neq \hat{b}(i)$, then it is determined that a decoder error occurred at time i.

As previously set forth, the encoder 25 outputs the $c(i)$'s to the $1/(1 \oplus D^2)$ precoder 30. The precoder 30 has at time, i, a state $s(i)=(s_2(i), s_1(i))$, an input, $c(i)$, and an output $x(i)$, where $x(i)=c(i) \oplus s_2(i)$. The state, $s(i)$, is updated for time i+1, for instance, as follows: $s(i+1)=(s_2(i+1),s_1(i+1))$, where $s_2(i+1)=s_1(i)$ and $s_1(i+1)=x(i)$. In an embodiment where the precoder 30 comprises $1/(1 \oplus D)$, the precoder 30 would have at time, i, a state $s(i)$, an input, $c(i)$, and an output $x(i)$, where $x(i)=c(i) \oplus s(i)$. The state, $s(i)$, is updated for time i+1, for instance, as follows: $s(i+1)=x(i)$.

In addition to the user bit sequence, $b(i)$'s, the encoder 25 may use a state, $s(i)=(s_2(i),s_1(i))$, of the precoder 30 to generate $c(i)$'s, which will be explained in more detail below. The precoder 30 is a finite state component and includes a memory to store the state, $s(i)$. Initially, a first state $(s_2(0), s_1(0))$ is preset to an initial value of, for instance, $(s_2(0), s_1(0))=(0, 0)$. In an alternative embodiment, the precoder 30 may be provided as $1/(1 \oplus D)$, where initially a first state, $s(0)$, is preset to an initial value of, for instance, $s(0)=0$.

Although the reproductions of the ECC coded sequence, $\hat{b}$ (i)'s, to the ECC decoder 65 should be same as the ECC coded sequence, b(i)'s, from the ECC 20 and the input to the precoder 30, c(i)'s, should be same as the output of the inverse of the precoder, ĉ (i)'s, the equality is not always possible because noise, such as media noise, is added to the output of the filters 35 and 40, z(i)'s. Further, it is desirable that typical channel errors do not corrupt many blocks in a same interleave, and that a length of typical channel errors is short. For instance, assuming that the encoder 25 is able to correct three errors in the same interleave, if four errors occur instead in the same interleave, then the encoder 25 might only be able to correct the first three errors but not the fourth one. Accordingly, the channel errors should not corrupt many blocks in the same interleave of the encoder 25 to work effectively. Also, it is desirable that short channel errors do not propagate into long decoder errors in the decoder 60, and that a number of non-zero values over a codeword is large. If these conditions are satisfied, then the hardware of the magnetic recording system is simple and efficient.

For exemplary purposes, four magnetic recording systems, H1, H2, H3, and H4, are described herein. The encoder 25 has a rate ri=ni/mi, an ECC block size, Si, and a depth of interleave, Ii. The encoder 25 receives ni values, b=(b(01)–b(ni)), and encodes the ni values into a codeword of length mi bits, c=(c(01)–c(mi)). The decoder 60 receives the mi bits, ĉ=(ĉ (01)–ĉ (mi)), which ideally are a reproduction of the input to the precoder 30, c(i)'s. However, due to errors at the output of the Viterbi detector 50, the decoder 60 receives the following: ĉ=c+e, where e is a noise error e=(e01–emi). Accordingly, the decoder 60 produces, $\hat{b}$=($\hat{b}$(01)–$\hat{b}$(ni)).

Given the error, e, a smallest index such that e(i1) is not zero is defined as i1, and a largest index such that e(i2) is not zero is defined as i2, where i1 and i2 are equal to zero if e=0. An effective length, L, of e is defined as:

$$L = i2 - i1 + 1,$$

where if e=0, then L=0

Hereinafter, the system H1 is described. In this instance, the encoder 25 is set up according to the following parameters:

Rate=64/65,
S=8, and
I=3

In the system H1, the encoder 25 has rate 64/65, that is, 64 bits input to the encoder 25 and 65 output bits, the ECC block size, S, is 8 bits, and the depth of the interleave, I, of 3.

Referring to Table 1, this table provides the encoder 25 parameters where a first row shows the 64 input bits to the encoder 25, b=(b(01)–b(64)). The 64 input bits are considered according to the block size, S. Thus, the first row illustrates the 64 input bits in groups of 8 bits (i.e., b01–b08, b09–b16, etc.), for S=8. The second row gives corresponding input blocks:

$$B(i) = (b((i-1)8+I), b((i-1)8+2), \ldots, b((i-1)8+7), b((i-1)8+8)),$$
$$0 < i \leq 8$$

The third row gives the interleave index of each block, B, where the interleaves are indexed 1–3. For instance, B2 belongs to the interleave having index 2.

TABLE 1

| Input bits | b(01)–b(08) | b(09)–b(16) | b(17)–b(24) | b(25)–b(32) | b(33)–b(40) | b(41)–b(48) | b(49)–b(56) | b(57)–b(64) |
|---|---|---|---|---|---|---|---|---|
| Input blocks | B1 | B2 | B3 | B4 | B5 | B6 | B7 | B8 |
| Interleave | 1 | 2 | 3 | 1 | 2 | 3 | 1 | 2 |

Accordingly, an interleave position for each input block is as follows:

| | | |
|---|---|---|
| B1 | B2 | B3 |
| B4 | B5 | B6 |
| B7 | B8 | |

In addition, the encoder 25 of system H1 includes a low rate H" encoder (not shown), such as a 16/17-trellis encoder, having a code rate of 16/17 for instance. The H" encoder has a lower rate than the encoder 25, thus, the H" encoder may involve other types of encoders, such as a 32/34-trellis code encoder. The H" encoder selects subsets B3 and B8 from blocks B1–B8 and maps B3 and B8 to u1 and u2, for example, where f=(f1, f2, ... f17), in this instance, where u1 includes 11 output bits (i.e., f1, f2, ..., f11) and u2 includes 6 output bits (i.e., f12, f13, ..., f17). The division of the output bits for u1 and u2 may vary and is done during initial set up of the system, in an arbitrary manner. It must be noted that a relationship between the subsets B3 and B8 with respect to u1 and u2 is non-linear. One of the many advantages of including the lower rate encoder, H" encoder, along with the encoder 25 is to assure that non-zero samplings will occur; thereby assuring that clocking will not drift. For instance, if a design requirement of the system provides that non-zeros are produced at three locations within the codeword, then the H" encoder would be set up to output u1, u2, and u3.

Accordingly, the encoder 25 performs a permutation of the blocks B1, B2, B4, B5, B6, and B7 and u1 and u2. To prevent channel errors from corrupting many blocks in the same interleave, u1 and u2, which are a function of B3 and B8, cannot be permutated next to the same interleave, that is, next to either B2, B5, or B6. Accordingly, because u1 and u2 cannot be permutated next to B2, B5, or B6, u1 and u2 can only be permutated next to B1, B4, and B7. For B4 to be next to u1 and B7 to be next to u2, B4 and B7 must be broken into B4' and B7' of 4 bits and B4" and B7" of 4 bits. The permutation is performed as shown in Table 2:

TABLE 2

| Permutation | B1 | B2 | B4' | u1 (1:11) | B4" | B5 | B6 | B7' | u2 (12:17) | B7" |
|---|---|---|---|---|---|---|---|---|---|---|
| Interleave, I | 1 | 2 | 1 | 2 or 3 | 1 | 2 | 3 | 1 | 2 or 3 | 1 |
| Error, e | e(01)–e(08) | e(09)–e(16) | e(17)–e(20) | e(21)–e(31) | e(32)–e(35) | e(36)–e(43) | e(44)–e(51) | e(52)–e(55) | e(56)–e(61) | e(62)–e(65) |
| Encoded bits | c(01)–c(08) | c(09)–c(16) | c(17)–c(20) | c(21)–c(31) | c(32)–c(35) | c(36)–c(43) | c(44)–c(51) | c(52)–c(55) | c(56)–c(61) | c(62)–c(65) |

Under u1 and u2, the interleave may be either 2 or 3 because u1 and u2 are a function of B3 and B8, which correspond to interleave 3 and 2, respectively. Referring to Table 2, in order for two blocks in the same interleave to be corrupted by an error, e, the effective length of, e, must be at least 6. In other words, L_min(H1)=6. Typically, if one bit is corrupted in one block, that bit may corrupt a remainder of bits in that block. Accordingly, with the correction capability on each interleave, t=1, the magnetic recording system, in accordance with an embodiment of the present invention, is able to correct an error e, if L(e)<L_min(H1)=6.

Referring to Table 2, in order for two blocks, B's, in the same interleave to be corrupted by the error, e, the effective length of the error, e, must be at least 6. In other words, L_min(H1)=6. For example if the error, e, spans from e16 to e21, then c16 and c21 will be corrupted. Therefore, B2 and in some cases B8 (because u2 is a function of B3 and B8) will be corrupted. Because both B2 and B8 are in interleave 2 of the ECC 20, if the correction capability on each interleave, t, is not>1, then the ECC 20 will not be able to correct the decoder error due to e.

Furthermore, the decoder 60 in system H1, receives $(\hat{c}(01)–\hat{c}(65))$ and generates $\hat{b}=(\hat{b}(01)–\hat{b}(64))$. The decoder 60 would further include an inverse (a low rate H" decoder (not shown)) of the H" encoder of the encoder 25 to map u1 and u2 and restore blocks B3 and B8. Table 3 describes how the decoder obtains $\hat{b}$'s. The H" decoder maps, $(\hat{c}(21)–\hat{c}(31), \hat{c}(62)–\hat{c}(65))$ to (vh01–vh16).

TABLE 3

| Interleave | 1 | 2 | 3 | 4 | 5 | 6 | 7 | 8 | 9 | 10 |
|---|---|---|---|---|---|---|---|---|---|---|
| Decoded bits | $\hat{b}(01)$–$\hat{b}(08)$ | $\hat{b}(09)$–$\hat{b}(16)$ | $\hat{b}(17)$–$\hat{b}(24)$ | $\hat{b}(25)$–$\hat{b}(28)$ | $\hat{b}(29)$–$\hat{b}(32)$ | $\hat{b}(33)$–$\hat{b}(40)$ | $\hat{b}(41)$–$\hat{b}(48)$ | $\hat{b}(49)$–$\hat{b}(52)$ | $\hat{b}(53)$–$\hat{b}(56)$ | $\hat{b}(57)$–$\hat{b}(64)$ |
| Map | $\hat{c}(01)$–$\hat{c}(08)$ | $\hat{c}(09)$–$\hat{c}(16)$ | vh01–vh08 | $\hat{c}(17)$–$\hat{c}(20)$ | $\hat{c}(32)$–$\hat{c}(35)$ | $\hat{c}(36)$–$\hat{c}(43)$ | $\hat{c}(44)$–$\hat{c}(51)$ | $\hat{c}(52)$–$\hat{c}(55)$ | $\hat{c}(62)$–$\hat{c}(65)$ | vh09–vh16 |

Hereinafter, the system H2 is described. In this instance, the encoder 25 is set up according to the following parameters:
Rate=80/81,
S=8, and
I=4

In the system H2, the encoder 25 has rate 80/81, that is, 80 bits input to the encoder 25 and 81 output bits, the ECC block size, S, is 8 bits, and the depth of the interleave, I, of 4.

Referring to Table 4, this table provides the encoder 25 parameters where a first row shows the 80 input bits to the encoder 25, b=(b01–80). The 80 input bits are considered according to the block size, S. Thus, the first row illustrates the 80 input bits in groups of 8 bits (i.e., b01–b08, b09–b16, etc.), for S=8. The second row gives corresponding input blocks:

$Bi=(b((i-1)8+1), b((i-1)8+2), \ldots, b((i-1)8+7), b((i-1)8+8)), 0<i\leq10$

The third row gives the interleave index of each block, B, where the interleaves are indexed 1–4.

TABLE 4

| Input bits | b(01)–b(08) | b(09)–b(16) | b(17)–b(24) | b(25)–b(32) | b(33)–b(40) | b(41)–b(48) | b(49)–b(56) | b(57)–b(64) | b(65)–b(72) | b(73)–b(80) |
|---|---|---|---|---|---|---|---|---|---|---|
| Input blocks | B1 | B2 | B3 | B4 | B5 | B6 | B7 | B8 | B9 | B10 |
| Interleave | 1 | 2 | 3 | 4 | 1 | 2 | 3 | 4 | 1 | 2 |

Accordingly, the interleave position for each input block is as follows:

| | | | |
|---|---|---|---|
| B1 | B2 | B3 | B4 |
| B5 | B6 | B7 | B8 |
| B9 | B10 | | |

In addition, similar to the system H1, the encoder 25 of system H2 includes the H" encoder. The H" encoder selects subsets B9 and B10 from blocks B1-B10 and maps B9 and B10 to u1 and u2, where u1 includes 8 bits and u2 includes 9 bits. It must be noted that a relationship between the subsets is non-linear. Accordingly, the encoder 25 performs a permutation of the blocks B1, B2, B4, B5, B6, B7, and B8 and u1 and u2. To prevent channel errors from corrupting many blocks in the same interleave, u1 and u2, which are a function of B9 and B10, cannot be permutated next to the same interleave, that is, next to either B1, B2, B5, or B6. Accordingly, because u1 and u2 cannot be permutated next to B1, B2, B5, or B6, u1 and u2 can only be permutated between B3 and B4 and B7 and B8. The permutation is performed as shown in Table 5:

TABLE 5

| Permutation | B1 | B2 | B3 | u1 (1:8) | B4 | B5 | B6 | B7 | u2 (9:17) | B8 |
|---|---|---|---|---|---|---|---|---|---|---|
| Interleave, I | 1 | 2 | 3 | 1 or 2 | 4 | 1 | 2 | 3 | 1 or 2 | 4 |
| Error, e | e(01)–e(08) | e(09)–e(16) | e(17)–e(24) | e(25)–e(32) | e(33)–e(40) | e(41)–e(48) | e(49)–e(56) | e(57)–e(64) | e(65)–e(73) | e(74)–e(81) |
| Encoded bits | c(01)–c(08) | c(09)–c(16) | c(17)–c(24) | c(25)–c(32) | c(33)–c(40) | c(41)–c(48) | c(49)–c(56) | c(57)–c(64) | c(65)–c(73) | c(74)–c(81) |

Under u1 and u2, the interleave may be either 1 or 2 because u1 and u2 are a function of B9 and B10, which correspond to interleave 1 and 2, respectively. Referring to Table 6, in order for two blocks in the same interleave to be corrupted by error, e, the effective length of, e, must be at least 10. In other words, L__min(H2)=10. For example if e spans e(16)–e(25), then c(16) and c(21) will be corrupted.

Therefore, B2 and in some cases B10 will be corrupted because u1 is a function of B9 and B10, which would not resolve the condition of not corrupting many blocks in the same interleave.

Furthermore, the decoder 60 in system H2, receives (ĉ(01)–ĉ(81)) and generates b̂=(b̂(01)–b̂(80)). The decoder 60 would further include the inverse H" decoder to map u1 and u2 and restore blocks B9 and B10. Table 6 describes how the decoder obtains b̂'s. The H" decoder maps, (ĉ(25)–ĉ(32), ĉ(65)–ĉ(73)) to (vh01–vH26).

encoder 25, b=(b01–b64). The 64 input bits are considered according to the block size, S. Thus, the first row illustrates the 64 input bits in groups of 8 bits (i.e., b01–b08, b09–b16, etc.), for S=8. The second row gives corresponding input blocks:

$$Bi=(b((i-1)8+1), b((i-1)8+2), \ldots, b((i-1)8+7), b(i-1)8+8)),$$
$$0 < i \leq 8$$

The third row gives the interleave index of each block, B, where the interleaves are indexed 1–4. For instance, B4 belongs to the interleave having index 4.

TABLE 7

| Input bits | b(01)–b(08) | b(09)–b(16) | b(17)–b(24) | b(25)–b(32) | b(33)–b(40) | b(41)–b(48) | b(49)–b(56) | b(57)–b(64) |
|---|---|---|---|---|---|---|---|---|
| Input blocks | B1 | B2 | B3 | B4 | B5 | B6 | B7 | B8 |
| Interleave | 1 | 2 | 3 | 4 | 1 | 2 | 3 | 4 |

Accordingly, the interleave position for each input block is as follows:

| B1 | B2 | B3 | B4 |
|---|---|---|---|
| B5 | B6 | B7 | B8 |

TABLE 6

| Interleave | 1 | 2 | 3 | 4 | 5 | 6 | 7 | 8 | 9 | 10 |
|---|---|---|---|---|---|---|---|---|---|---|
| Decoded bits | b̂(01)–b̂(08) | b̂(09)–b̂(16) | b̂(17)–b̂(24) | b̂(25)–b̂(32) | b̂(33)–b̂(40) | b̂(41)–b̂(48) | b̂(49)–b̂(56) | b̂(57)–b̂(64) | b̂(65)–b̂(72) | b̂(73)–b̂(80) |
| Map | ĉ(01)–ĉ(08) | ĉ(09)–ĉ(16) | ĉ(17)–ĉ(24) | ĉ(33)–ĉ(40) | ĉ(41)–ĉ(48) | ĉ(49)–ĉ(56) | ĉ(57)–ĉ(64) | ĉ(74)–ĉ(81) | vh01–vh08 | vh09–vh16 |

Hereinafter, the system H3 is described. In this instance, the encoder 25 is set up according to the following parameters:

Rate=64/65,

S=8, and

I=4

In the system H3, the encoder 25 has rate 64/65, that is, 64 bits input to the encoder 25 and 65 output bits, the ECC block size, S, is 8 bits, and the depth of the interleave, I, of 4.

Referring to Table 7, this table provides the encoder 25 parameters where a first row shows the 64 input bits to the In addition, the encoder 25 of system H3 includes the H" encoder. The H" encoder selects subsets B7 and B8 from blocks B1–B8 and maps B7 and B8 to u1 and u2, where u1 includes 8 bits and u2 includes 9 bits. It must be noted that a relationship between the subsets is non-linear. Accordingly, the encoder 25 performs a permutation of the blocks B1, B2, B3, B4, B5, and B6, and u1 and u2. To prevent channel errors from corrupting many blocks in the same interleave, u1 and u2, which are a function of B7 and B8, cannot be permutated next to the same interleave, that is, next to either B3 or B4. Accordingly, because u1 and u2 cannot be permutated next to B3 or B4, u1 and u2 can only be permutated next to B1, B2, B5, and B6. The permutation is performed as shown in Table 8:

TABLE 8

| Permutation | B1 | u1 (1:8) | B2 | B3 | B4 | B5 | u2 (9:17) | B6 |
|---|---|---|---|---|---|---|---|---|
| Interleave, I | 1 | 3 or 4 | 2 | 3 | 4 | 1 | 3 or 4 | 2 |
| Error, e | e(01)–e(08) | e(09)–e(16) | e(17)–e(24) | e(25)–e(32) | e(33)–e(40) | e(41)–e(48) | e(49)–e(57) | e(58)–e(65) |
| Encoded bits | c(01)–c(08) | c(09)–c(16) | c(17)–c(24) | c(25)–c(32) | c(33)–c(40) | c(41)–c(48) | c(49)–c(57) | c(58)–c(65) |

Under u1 and u2, the interleave may be either 3 or 4 because u1 and u2 are a function of B7 and B8, which correspond to interleave 3 and 4, respectively. Referring to Table 9, in order for two blocks in the same interleave to be corrupted by error, e, the effective length of, e, must be at least 6. In other words, L_min(H3)=10. For example if e spans e(40)–e(49), then c(40) and c(49) will be corrupted. Therefore, B4 and in some cases B8 will be corrupted because f1 is a function of B7 and B8, which would not resolve the condition of not corrupting many blocks in the same interleave.

Furthermore, the decoder 60 in system H3, receives (ĉ(01)–ĉ(65)) and generates b̂=(b̂(01)–b̂(64)). The decoder 60 would further include the H" decoder to map u1 and u2 and restore blocks B7 and B8. Table 9 describes how the decoder obtains b̂'s. The H" decoder maps, (ĉ(09)–ĉ(16), ĉ(49)–ĉ(57)) to (vh01–vh36).

where (s1, s2) is the state of the precoder when c(01) is processed. Similar to the system H1, L_min(H4)=6.

Furthermore, in the system H4, the decoder 60 receives (ĉ(01)–ĉ(66)) and generates b̂=(b̂(01)–b̂(64)) as shown in the system H1. Specifically, the decoder 60 drops, ĉ(66)) and generates the received codeword, and processes (ĉ(01)–ĉ(65)) as shown in the system H1 to generate b̂=(b̂(01)–b̂(64)). In an alternative embodiment, the parity bit may be inside the codeword. Furthermore, in an alternative embodiment, more than one bit may be used to force an algebraic structure of a code.

In an embodiment of the present invention, the blocks B1, B2, etc. selected to be further encoded by the low rate H" encoder in the encoder 25, are selected so that no two consecutive blocks in the same codeword are in the same interleave and that no two blocks in two consecutive code-

TABLE 9

| Interleave | 1 | 2 | 3 | 4 | 5 | 6 | 7 | 8 |
|---|---|---|---|---|---|---|---|---|
| Decoded bits | b̂(01)–b̂(08) | b̂(09)–b̂(16) | b̂(17)–b̂(24) | b̂(25)–b̂(32) | b̂(33)–b̂(40) | b̂(41)–b̂(48) | b̂(49)–b̂(56) | b̂(57)–b̂(64) |
| Map | ĉ(01)–ĉ(08) | ĉ(17)–ĉ(24) | ĉ(25)–ĉ(32) | ĉ(33)–ĉ(40) | ĉ(41)–ĉ(48) | ĉ(57)–ĉ(64) | vh01–vh08 | vh09–vh16 |

Hereinafter, the system H4 is described illustrating an even parity system. In this instance, system H4 is similar to system H1 except that the encoder 25 has a rate of 64/66. That is, the encoder 25 is set up according to the following parameters:

Rate=64/66,

S=8, and

I=3

In the system H1, the ECC block size, S, is 8 bits, and the depth of the interleave, I, of 3. The encoder 25 maps b(01)–b(64) to (c(01)–c(65),c(66)), where c(01)–c(65) is obtained using the system H1 previously described. The encoder 25 in the system H4 processes c(66) such that the output corresponding to c(01)–c(66) has an even parity at the output of the precoder 30. More specifically, $$C(66) = s1 + s2 + c(01) + c(02) + c(05) + c(06) + c(09) + c(10) + c(13) +$$
$$c(14) + c(17) + c(18) + c(21) + c(22) + c(25) + c(26) + c(29) + c(30) +$$
$$c(33) + c(34) + c(37) + c(38) + c(41) + c(42) + c(45) + c(46) + c(49) +$$
$$c(50) + c(53) + c(54) + c(57) + c(58) + c(61) + c(62) + c(65)(\text{mod } 2),$$

words are in the same interleave. For instance, assuming that the encoder 25 is set up according to the following parameters:

Rate=80/81,

S=8, and

I=4

Further, the encoder 25 receives input bits b(01) to b(160) or, equivalently, input blocks B1 to B20, where:

$$Bi = (b((i-1)8+1), b((i-1)8+2), \ldots, b((i-1)8+7), b((i-1)8+8)),$$
$$0 < i \leq 20$$

Referring to Table 10, this table provides the encoder 25 parameters where a first row shows a first 80 input bits to the encoder 25, b=(b(01)–b(80)). The 80 input bits are considered according to the block size, S. Thus, the first row illustrates the 80 input bits in groups of 8 bits (i.e., b(01)–b(08), b(09)–b(16), etc.), for S=8. Table 11 provides the encoder 25 parameters where a first row shows a second 80 input bits to the encoder 25, b=(b(81)–b(160)). The third row of Table 10 and Table 11 gives the interleave index of each block, B, where interleaves are indexed 1–4.

TABLE 10

| Input Bits | b(01)–b(08) | b(09)–b(16) | b(17)–b(24) | b(25)–b(32) | b(33)–b(40) | b(41)–b(48) | b(49)–b(56) | b(57)–b(64) | b(65)–b(72) | b(73)–b(80) |
|---|---|---|---|---|---|---|---|---|---|---|
| Input blocks | B1 | B2 | B3 | B4 | B5 | B6 | B7 | B8 | B9 | B10 |
| Interleave | 1 | 2 | 3 | 4 | 1 | 2 | 3 | 4 | 1 | 2 |

TABLE 11

| Input bits | b(81)–b(88) | b(90)–b(96) | b(97)–b(104) | b(105)–b(112) | b(113)–b(120) | b(121)–b(128) | b(129)–b(136) | b(137)–b(144) | b(145)–b(152) | b(153)–b(160) |
|---|---|---|---|---|---|---|---|---|---|---|
| Input blocks | B11 | B12 | B13 | B14 | B15 | B16 | B17 | B18 | B19 | B20 |
| Interleave | 3 | 4 | 1 | 2 | 3 | 4 | 1 | 2 | 3 | 4 |

Accordingly, the interleave position for each input block is as follows:

| B1 | B2 | B3 | B4 |
|---|---|---|---|
| B5 | B6 | B7 | B8 |
| B9 | B10 | B11 | B12 |
| B13 | B14 | B15 | B16 |
| B17 | B18 | B19 | B20 |

In one embodiment, if B8, B9, and B10 are selected and mapped to u1 and u2, then the encoder 25 permutates blocks B1, B2, B3', B3", B4, B5, B6, B7', B7", u1, and u2 of the first codeword as shown in Table 12. The first block of the second codeword is also shown in Table 12, to be later discussed.

TABLE 12

| Permutation | B1 | B2 | B3' | u1 | B3" | B4 | B5 | B6 | B7' | u2 | B7" | B11 |
|---|---|---|---|---|---|---|---|---|---|---|---|---|
| Interleave, I | 1 | 2 | 3 | 1, 2, or 4 | 3 | 4 | 1 | 2 | 3 | 1, 2, or 4 | 3 | 3 |

As shown in Table 12, the last block B7" of the first codeword and the first block of the second codeword B11 are in the same interleave, 3, which is an undesirable event. Accordingly, rather than selecting B8, B9, and B10, the system would select B7, B9, and B10 to assure that no two blocks in the same codeword are in the same interleave and that no two blocks in two consecutive codewords are in the same interleave to assure that the predetermined error correction capability, t, is not exceeded, as illustrated in Table 13:

TABLE 13

| Permutation | B1 | B2 | B3 | B4' | u1 | B4" | B5 | B6 | B8' | u2 | B8" | B11 |
|---|---|---|---|---|---|---|---|---|---|---|---|---|
| Interleave, I | 1 | 2 | 3 | 4 | 1, 2, or 3 | 4 | 1 | 2 | 4 | 1, 2, or 3 | 4 | 3 |

Figure 2:
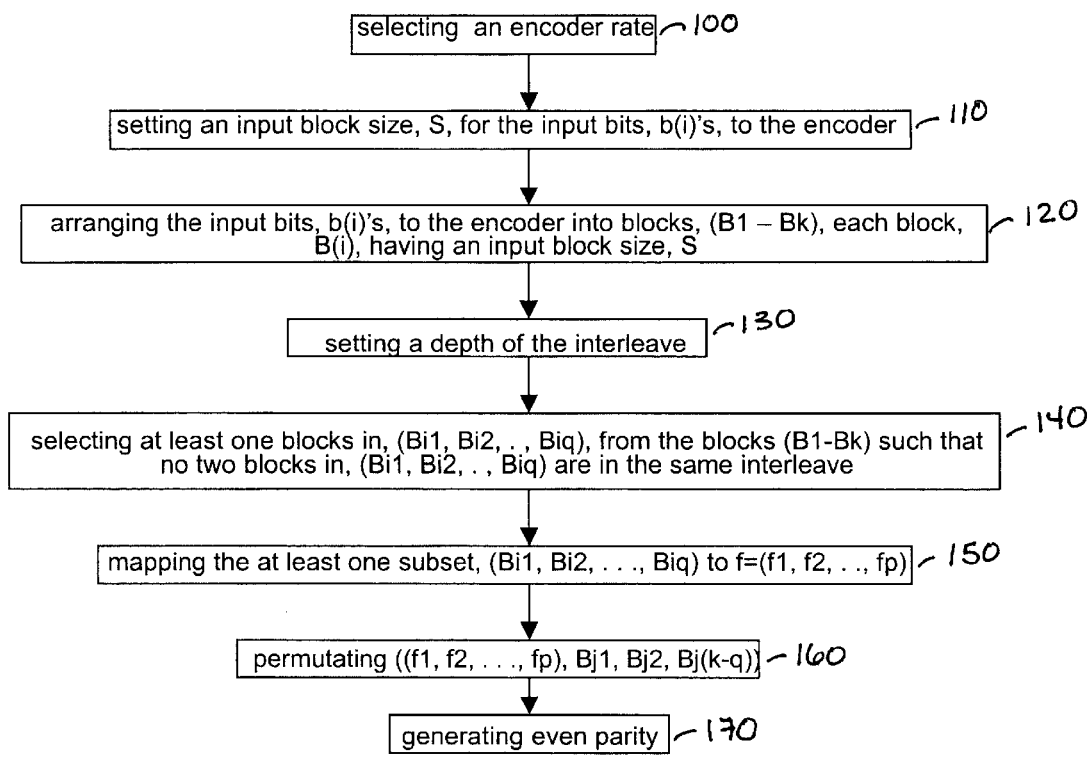
FIG. 2 is a flowchart illustrating a process performed by the magnetic recording system, in accordance with an embodiment of the present invention.

FIG. 2 is a flowchart illustrating an interleave process performed by the magnetic recording system, in accordance with an embodiment of the present invention. At operation 100, an encoder rate is selected, for instance, 64/65 as in the system H1. At operation 110, the input block size, S, is selected for the input bits, b(i)'s, to the encoder. At operation 120, the input bits, b(i)'s, to the encoder 25 are arranged into blocks, (B1–Bk), where each block, (B1–Bk), has the input block size, S, where k is a total number of block as (a total number of b(i)'s)/S. At operation 130, a depth of the interleave I, where I<k, is selected. At operation 140, at least one block, (Bi1, Bi2, ..., Biq), is selected from the blocks (B1–Bk) such that no two blocks in, (Bi1, Bi2, ..., Biq) are in the same interleave, where q is a number of blocks selected from k blocks. Accordingly, (Bj1, Bj2, ... Bj(k−q))=(B1–Bk)−(Bi1, Bi2, ..., Biq), are the blocks remaining after the at least one subset, (Bi1, Bi2, ..., Biq), is selected.

At operation 150, the at least one subset, (Bi1, Bi2, ..., Biq) is mapped to f=(f1, f2, ..., fp) using the low rate encoder, such as the 16/17 trellis encoder, in the encoder 25, where p is a number of output bits, f, from the low rate encoder, for instance, p=17 in this case. At operation 160, ((f1, f2, ..., fp), Bj1, Bj2, Bj(k−q)) are permutated where the output of the encoder 25 is c=(c(1), c(2), ..., c(p+(k−q)S))=P(((f1, f2, ..., fp), Bj1, Bj2, Bj(k−q)), where P is a permutation operating on the bits of vector ((f1, f2, ..., fp), Bj1, Bj2, Bj(k−q)) and satisfying the following (a) and (b) conditions:

(a) If for, c(i1) and c(i2), in c, where c(i1) and c(i2) are randomly chosen,
  (c(i 1 ) ∈ f and c(i2) ∈ B) and (c(i1) and c(i2) are in a same interleave), OR
  (c(i1) ∈ B and c(i2) ∈ B) and (c(i1) and c(i2) are in a same interleave) AND (c(i1)&c(i2) are in different blocks), where B=(Bj1, Bj2, ... Bj(k−q))=(B1−Bk)−(Bi1, Bi2, ..., Biq)
  then, $|i1-i2|>\hat{M}$, for some predetermined integer $\hat{M}$.
(b) A last bit(s) in a codeword and a first bit(s) in a next codeword cannot be in a same interleave.

Furthermore, the blocks in the codeword are defined as parsing the codeword, c, into blocks P1 and PL such that all bits in Pi, $1 \leq i \leq L$, come from one of the blocks ((Bj1, Bj2, ... Bj(k−q)), f) and Pi and Pi+1 come from different blocks.

At operation 170, the system adds a bit, c(m), at an end of the codeword to generate an even parity of the codeword, wherein the codeword includes c(1) to c(m), for m=p+(k+q)S+1. In general, several bits may be added to generate other parity structures or algebraic structures.

In an alternative embodiment the correction capability on each interleave may be t, where at least one subset, (Bi1, Bi2, . . . , Biq), is selected from the blocks (B1–Bk) such that no t+1 blocks in, (Bi1, Bi2, . . . , Biq) are in the same interleave, where q is a number of blocks selected from k blocks.

The many features and advantages of the invention are apparent from the detailed specification and, thus, it is intended by the appended claims to cover all such features and advantages of the invention that fall within the true spirit and scope of the invention. Although the system of the present invention has been described in view of a magnetic recording medium, the system may be incorporated and applied to other communication systems. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A system to modulate coding based on an error correcting code (ECC) interleave structure, comprising:
   a first encoder encoding an input stream of bits comprising input blocks sorted into interleaves; and
   a second encoder encoding a subset of the input blocks to produce output blocks, wherein the first encoder permutates a remainder of the input blocks and the output blocks to produce a codeword.

2. The system as recited in claim 1, wherein the first encoder providing an effective length of an error, e, for two input blocks in a same interleave to be corrupted by the error, e.

3. The system as recited in claim 1, further comprising:
   a decoder inverse decoding the output blocks to restore the input blocks.

4. The system as recited in claim 1, wherein the at least one subset of the input blocks are selected so that no two blocks in the same codeword are in the same interleave and that no two blocks in two consecutive codewords are in the same interleave.

5. A system to modulate coding based on an error correcting code (ECC) interleave structure, comprising:
   a first encoder encoding an input stream of bits, sorting the input bits into interleaves of input blocks, and selecting at least one subset of the input blocks, wherein each input block comprises a predetermined input block size;
   a second encoder encoding the at least one subset of the input blocks to output blocks, wherein the first encoder permutates a remainder of the input blocks and the output blocks to prevent channel errors from being greater than a correction capability of the interleave; and
   a decoder inverse decoding the output blocks to restore the input blocks.

6. The system as recited in claim 5, wherein no two of the at least one subset selected is in the same interleave.

7. The system as recited in claim 5, wherein the first encoder providing an effective length of an error, e, for two input blocks in a same interleave to be corrupted by the error, e.

8. The system as recited in claim 5, wherein the first encoder comprises a rate different from a rate of the second encoder.

9. The system as recited in claim 5, wherein the first encoder selects the at least one subset of the input blocks so that no two consecutive blocks in the same codeword are in the same interleave and that no two blocks in two consecutive codewords are in the same interleave.

10. The system as recited in claim 5, wherein the first encoder adds a bit at an end of the codeword to generate an even parity of the codeword.

11. The system as recited in claim 5, wherein the first encoder adds several bits to generate other parity structures or algebraic structures.

12. A method to modulate coding based on an error correcting code (ECC) interleave structure, comprising:
   encoding an input stream of bits with a first encoder;
   sorting the input bits into interleaves of input blocks, each input block comprising a predetermined input block size;
   selecting at least one subset of the input blocks;
   encoding with a second encoder the at least one subset of the input blocks to output blocks;
   permutating a remainder of the input blocks and the output blocks to prevent channel errors from being greater than a correction capability of the interleave; and
   inverse decoding the output blocks to restore the input blocks.

13. The method as recited in claim 12, wherein the selecting of the at least one subset of the input blocks so that no two consecutive blocks in the same codeword are in the same interleave and that no two blocks in two consecutive codewords are in the same interleave.

14. The method as recited in claim 12, further comprising:
   providing an effective length of an error, e, for two input blocks in a same interleave to be corrupted by the error, e.

15. The method as recited in claim 12, further comprising:
   adding a bit at an end of the codeword to generate an even parity of the codeword.

16. The method as recited in claim 12, further comprising:
   adding several bits to generate other parity structures or algebraic structures.

17. A method to modulate coding based on an error correcting code (ECC) interleave structure, comprising:
   selecting an n/m rate of a first encoder;
   receiving an input signal comprising input bits, b(i)'s, wherein i=1, 2, . . . n;
   selecting an input block size, S, for the input bits, b(i)'s;
   interleaving the input bits, b(i)'s, into blocks, (B1–Bk), each block comprising the input block size, S, wherein k=n/S;
   selecting at least one subset, (Bi1, Bi2, . . . , Biq), from the blocks, wherein q<k;
   mapping the at least one subset, (Bi1, Bi2, . . . , Biq) to an output vector, f=(f1, f2, . . . , fp), of a second encoder within the first encoder, wherein p is a number of output bits, f, from the second encoder; and
   permutating ((f1, f2, . . . , fp), Bj1, Bj2, Bj(k−q)) to prevent channel errors from being greater than a correction capability in the interleave, wherein (Bj1, Bj2, . . . Bj(k−q))=(B1–Bk)−(Bi1, Bi2, . . . , Biq), are the blocks remaining after the at least one subset, (Bi1, Bi2, . , Biq), is selected and the permutating is a permutation, P, operating on the bits of vector ((f1, f2, . . . , fp), Bj1, Bj2, Bj(k−q)).

18. The method as recited in claim 17, wherein no two of the at least one subset, (Bi1, Bi2, . . . , Biq), selected is in the same interleave.

19. The method as recited in claim 17, wherein no t+1 of the at least one subset, (Bi1, Bi2, . . . , Biq), selected is in the same interleave, where t is a correction capability on each interleave.

20. The method as recited in claim 17, wherein an output of the first encoder and the permutation, P, comprise the following relationship: c=(c(1), c(2) c(p+(k−q) S))=P(((f1, f2, . . . , fp), Bj1, Bj2, Bj(k−q)).

21. The method as recited in claim 20, wherein the permutation, P, satisfies:

(c(i1) $\in$ f and c(i2) $\in$ B) and (c(i1) and c(i2) are in a same interleave), OR (c(i1) $\in$ B and c(i2) $\in$ B) and (c(i1) and c(i2) are in a same interleave) AND (c(i1)&c(i2) are in different blocks), where B=(Bj1, Bj2, . . . Bj(k−q))=(B1−Bk)−(Bi1, Bi2, . . . , Biq) and c=c(i1) and c(i2), then, then, |i1−i2|>$\hat{M}$, for some predetermined integer $\hat{M}$, and a last bit in a codeword and a first bit in a next codeword are not in a same interleave, wherein (Bj1, Bj2, . . . Bj(k−q))=(B1−Bk)−(Bi1, Bi2, . . . , Biq) comprise the blocks remaining after the at least one subset, (Bi1, Bi2, . . . , Biq), is selected.

22. The method as recited in claim 17, further comprising:

providing an effective length of an error, e, for two input blocks in a same interleave to be corrupted by the error, e.

23. The method as recited in claim 17, further comprising:

adding a bit, c(m), at an end of the codeword to generate an even parity of the codeword, wherein the codeword includes c(1) to c(m), for m=p+(k+q)S+1.

24. The method as recited in claim 17, further comprising:

inverse decoding (f1, f2, . . . , fp) to restore the at least one subset, (Bi1, Bi2, . . . , Biq), selected.

25. A computer readable medium storing a program for controlling at least one computer to perform a method comprising:

encoding an input stream of bits with a first encoder;

sorting the input bits into interleaves of input blocks, each input block comprising a predetermined input block size;

selecting at least one subset of the input blocks;

encoding with a second encoder the at least one subset of the input blocks to output blocks;

permutating a remainder of the input blocks and the output blocks to prevent channel errors from being greater than a correction capability of the interleave; and inverse decoding the output blocks to restore the input blocks.

* * * * *

UNITED STATES PATENT AND TRADEMARK OFFICE
CERTIFICATE OF CORRECTION

PATENT NO.    : 6,774,825 B2
DATED         : August 10, 2004
INVENTOR(S)   : William G. Bliss et al.

It is certified that error appears in the above-identified patent and that said Letters Patent is hereby corrected as shown below:

<u>Title page</u>,
Item [56], References Cited, OTHER PUBLICATIONS, "Encoding and Decoding Apparatus and Method" reference, change "US Application 10,066,658)" to
-- (US Application 10/066,658) --.

<u>Column 17</u>,
Line 13, change "c=(c(1), c(2) c(p+(k-q) S))" to -- c=(c(1), c(2),…, c(p+(k-q) S)) --.

Signed and Sealed this

Fourth Day of January, 2005

JON W. DUDAS
*Director of the United States Patent and Trademark Office*